United States Patent [19]

Lemelson

[11] Patent Number: 4,853,514

[45] Date of Patent: Aug. 1, 1989

[54] BEAM APPARATUS AND METHOD

[76] Inventor: Jerome H. Lemelson, 48 Parkside Dr., Princeton, N.J. 08540

[21] Appl. No.: 921,268

[22] Filed: Oct. 21, 1986

Related U.S. Application Data

[63] Continuation of Ser. No. 571,188, Apr. 24, 1975, abandoned, which is a continuation of Ser. No. 849,013, Aug. 11, 1969, abandoned, which is a continuation-in-part of Ser. No. 691,676, Nov. 27, 1967, abandoned, and a continuation-in-part of Ser. No. 422,875, Nov. 25, 1964, Pat. No. 3,461,347, and a continuation-in-part of Ser. No. 710,517, Mar. 5, 1968, abandoned, and a continuation-in-part of Ser. No. 501,395, Oct. 22, 1965, Pat. No. 3,371,404, and a continuation-in-part of Ser. No. 421,897, Dec. 29, 1964, Pat. No. 3,504,063, which is a continuation-in-part of Ser. No. 734,340, May 19, 1958, Pat. No. 3,173,175.

[51] Int. Cl.$^4$ .................. H01J 37/317; H05B 7/10
[52] U.S. Cl. ........................ 219/121.12; 219/121.15
[58] Field of Search ............ 313/339, 348, 455; 219/121 EB, 121 EM, 121 L, 121 LM, 121 R, 121 EE, 121 EF, 121 EG, 121 EJ, 121 EK, 121 EX, 121 EU, 121.12, 121.35, 121.6, 121.85, 121.11, 121.15, 121.16, 121.17, 121.19, 121.2, 121.31, 121.28

[56] References Cited

U.S. PATENT DOCUMENTS

| | | | |
|---|---|---|---|
| 3,087,211 | 4/1963 | Howe | 219/121 EU |
| 3,165,619 | 1/1965 | Cohen | 219/121 EC |
| 3,303,319 | 2/1967 | Steigerwald | 219/121 EB |
| 3,330,696 | 7/1967 | Ullery | 219/121 LY |
| 3,515,932 | 6/1970 | King | 313/339 |

Primary Examiner—Teresa J. Walberg
Attorney, Agent, or Firm—Neil F. Markva

[57] ABSTRACT

Apparatus and method employ beamed radiation to perform controlled deposition of matter onto a substrate. The apparatus generates an intense electron beam or a laser beam directed through a reaction chamber against the surface of a workpiece supported within such chamber while matter in the form of a solid rod, solid particles or molecules of a gas or vapor is controllably fed into the beam. The beam melts solid material in rod or wire form to produce fine droplets or vapor directed along the beam to the surface of the workpiece intersected by the beam and deposited thereon. Alternatively, the radiation of the beam may intersect a gaseous or vaporous form of the matter to be deposited. The beam effects both the heating of the workpiece and the deposition of the matter or a portion thereof onto a select portion of the workpiece surface intersected by the beam. A master controller or computer controls a relative scanning movement between the beam and the workpiece to coat or deposit material on a select area or areas of the work.

24 Claims, 2 Drawing Sheets

BEAM APPARATUS AND METHOD

CROSS REFERENCE TO RELATED APPLICATIONS

This is a contnuation of application Ser. No. 571,188 filed Apr. 24, 1975 for Beam Apparatus and Methods, now abandoned, which was a continuation of Ser. No. 849,013, now abandoned, filed Aug. 11, 1969 as a continuation-in-part of application Ser. No. 691,676 filed Nov. 27, 1967, now abandoned, Ser. No. 422,875 filed Nov. 25, 1964, now U.S. Pat. No. 3,461,347, Ser. No. 710,517 filed Mar. 5, 1968 now abandoned, Ser. No. 501,395 filed Oct. 22, 1965 (now U.S. Pat. No. 3,371,404) and Ser. No. 421,897 filed Dec. 29, 1964 (now U.S. Pat. No. 3,504,063), the latter being a continuation-in-part of application Ser. No. 734,340 filed May 9, 1958 (now U.S. Pat. No. 3,173,175).

FIELD OF THE INVENTION

This invention is in the field of depositing and coating materials onto substrates, such as articles of manufacture, utilizing radiant energy to heat and condition the material to be deposited and the material of the article receiving such deposition material.

DESCRIPTION OF THE PRIOR ART

The prior art consists of apparatus and methods employing flames, sputtering, explosives and the like to deposit and bond coating materials to substrates. Electron beams have also been employed to melt material from the end of a rod or billet and to allow same to flow by gravity against a surface for refining metals. Such processes suffer shortcomings such as contamination of the deposited material, limitations to the amount of material which may be deposited in a given time interval and other shortcomings.

SUMMARY OF THE INVENTION

This invention relates to an apparatus and method for predeterminately operating on matter by means of intense radiation, such as generated by an electron gun or a laser. Before the making of this invention, it was known to employ an electron beam generated by an electron gun to melt or erode material of a substrate made of metal, by directing such beam at a select portion of a metal member to bore a hole therein or to weld two or more members together by the localized melting of material.

The instant invention is directed primarily to an apparatus which may perform such prior art operations but, more particularly, may also perform operations in which material or materials are predeterminately directed against and deposited on a substrate which is intersected by the beam. As a result and by means of the apparatus provided herein, various new products may be fabricated such as electronic circuits or devices requiring the selective and controlled deposition of predetermined amounts of doping materials, conducting and semi-conducting materials as well as insulating or isolating materials in a manner to form a desired composite electrical device or circuit. The apparatus may also be utilized for predeterminately depositing materials on substrates to decorate same, form various types of masks, weld or otherwise join members or to predeterminately form contoured surfaces such as molds, optical devices or other articles by either or both the operations of selective deposition and selective erosion.

Accordingly, it is a primary object of the instant invention to provide a new and improved apparatus and method for operating on matter by means of a high energy radiation beam.

Another object is to provide an improved apparatus and method for forming electrical circuits and circuit components.

Another object is to provide an apparatus and method for selectively controlling the flow of one component of a composite article to the surface of another component thereof and for selectively uniting the two in a single operation.

Another object is to provide an electron beam apparatus which may not only selectively or predeterminately erode portions of a substrate but may also be utilized to both selectively and predeterminately deposit material onto selected areas of the substrate.

Another object is to provide an apparatus and method for forming contoured surfaces of both convex and concave shape without the need to machine same by conventional techniques.

Another object is to provide improvements in an apparatus for selectively depositing material onto a substrate by means of an intense radiation beam.

Another object is to provide a new and improved electron beam apparatus which is computer controlled.

With the above and such other objects in view as may hereinafter more fully appear, the invention consists of the novel constructions, combinations and arrangements of parts as will be more fully described and illustrated in the accompanying drawings, but it is to be understood that changes, variations and modifications may be resorted to which fall within the scope of the invention as claimed.

Figure 1:
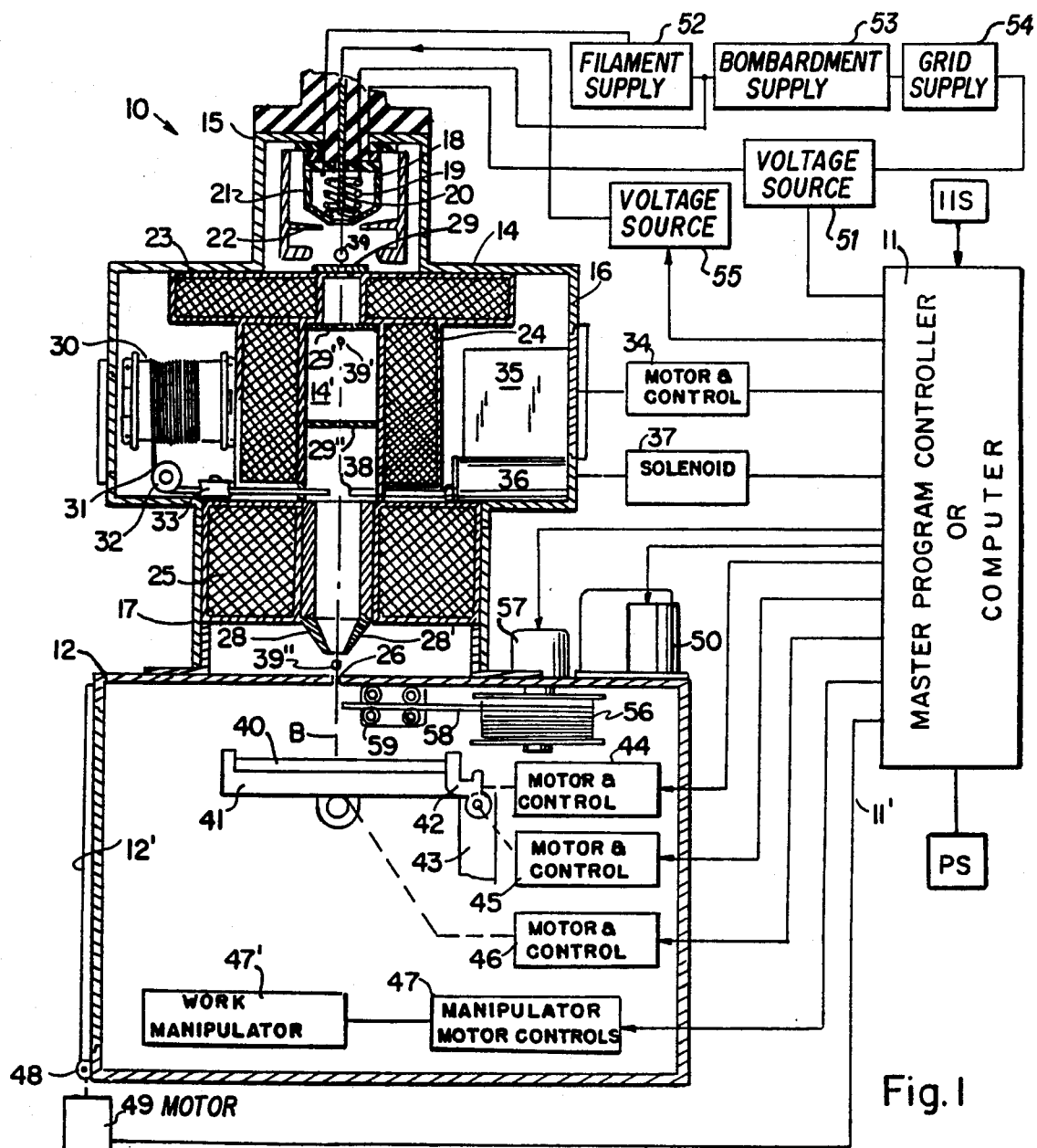
FIG. 1 is a side view with parts broken away for clarity of an electron beam apparatus which may be operated to predeterminately deposit material onto a substrate as well as to erode said substrate.

Referring now to the drawings, FIG. 1 illustrates an electron beam apparatus 10 which may be operated to perform a plurality of different functions including the selective deposition of one or more materials onto a substrate and/or the selective erosion or machining of said substrate. The apparatus 10 is composed of a chamber 12 containing work to be processed by an electron beam B which is generated within and directed through a chamber 14 disposed on top of the chamber 12 communicating with said chamber 12 by means of a small opening 26 in the upper wall of chamber 12. Disposed at the upper end of chamber 14 in a housing 15 is an electron beam generating assembly 18 which includes a filament 19 surrounding a rod-like cathode 20. The rod-shaped emitter 20 is indirectly heated by the filament 19 and generates an electron beam when a suitable source of high voltage 55 is connected to the emitter 19. Surrounding the described elements is a heat shield 21 and disposed directly beneath and adjacent the heat shield is a grid 22. Suitable filament supply, bombardment supply and grid supply means denoted 52, 53 and 54 are provided and connected to the respective elements of the emission assembly 18 for generating a suitable electron beam which is directed through a small opening in an anode plate 29, thence into an elongated passageway 14' which is shown surrounded by electro-magnetic coils denoted 23, 24 and 25, the purpose of which will be described. Plates 29, 29' and 29'' contain collimating slits for the beam B.

At the end of passageway 14', the beam passes a pair of focusing pole pieces 28 and 28' which serve to focus the beam through an opening 26 in the upper wall of chamber 12 against a selected area of a work piece 40 disposed in alignment with said opening.

The hereinabove described electron beam apparatus may be modified or supplemented with features found in known electron gun apparatus such as provided, for example, in U.S. Pat. Nos. 2,944,172 and 3,009,050 and in the texts "The Focusing of Charged Particles" edited by Albert Septier.

The work piece 40 is shown as a flat substrate such as a sheet or plate of metal or insulating material such as ceramic or plastic and may comprise an electronic circuit board or other device on which it is desired to perform operations of selectively adding material thereto and/or eroding or removing material therefrom. The substrate 40 is shown secured to a fixture or table 41 which is operative to move at least in two directions by predeterminately controlling respective motors 44 and 46 so as to locate any particular area of the substrate 40 in direct alignment with the opening 26 and the beam passed therethrough to permit preprogrammed operations of said beam on said substrate. A solenoid or motor 45, when controllably operated, actuates a clamp 42 which operates to secure the work piece 40 on the fixture 41 or release same so that it may be removed from said fixture. The support 41 is movably mounted with respect to a base 43 and is preferably positionally controlled by respective lead screws driven by the motors 44 and 46 in accordance with the manner of conventionally positioning a work table with respect to a machine tool. Notation 47 refers to one or more motors and controls therefore for operating an automatic manipulator 47' located either within or exterior of the chamber 12 and operative to remove individual units of work from the table 41 and to replace same with the new work to be processed in synchronization with the operation of the motor 45 operating the clamp 42. A door 12' is opened and closed by means of a motor 49 operating a suitable cam mechanism 48 at the door hinge to permit work to be inserted into and removed from chamber 12.

While the described electron beam generating means does not ordinarily require vacuum to generate and direct the electron beam against the work, a vacuum pump 50 is illustrated in FIG. 1 and is operatively connected to chamber 12 in the event that certain types of operations require that the work, during bombardment by the beam, be provided in a vacuum.

A master controller 11, such as an adjustable multicircuit, self-recycling timer or other form of program controller or computer, is provided having a plurality of outputs 11' on which are generated respective command control signals for controlling all of the described motors and other servos as well as those which will be described hereafter, so that the apparatus 10 may be operated in a preprogrammed manner which includes the replacement of work previously processed with new work suitably aligned on the fixture or table 41, the predetermined location and subsequent movement of said table 41 to bring different areas thereof in alignment with the beam, the programmed operation of the beam and, as will be described hereafter, the programmed admission of one or more materials to the electron beam to permit their selective deposition onto selected areas of the surface of work piece 40 for the construction of electrical circuits, the selective contouring of plates, or the selective coating of articles.

Materials to be deposited onto the surface of the substrate 40 may be admitted to the immediate vicinity of chamber 12 or at a plurality of points along the path of travel of the electron beam. Said material may be in the form of a solid rod or wire which is directed into the electron beam and melted or vaporized thereby and carried along or within said beam to the area of the surface of the substrate intersected by said beam so as to be deposited thereon or diffused into the outer stratum of said substrate. The manner in which the material is deposited or diffused will be a function of the intensity of the beam which may be a constant potential or variable in accordance with command control signals generated by the master controller 11. Accordingly, notation 55 refers to a source of high potential energy connected to the rod cathode. In certain instances, it may be desirable to provide an electronic or motor operated means within the unit 55 for varying the potential output thereof in accordance with a variable compound control signal generated on the input thereto by the master controller 11. Suitable means for varying the voltages applied to the filament and grid located in blocks 52 and 54 may also be provided which are varied in accordance with signals generated by the master controller 11. Accordingly, by such means, the potential and characteristics of the beam as it passes through the opening in anode 29 in the chamber 14', may be predeterminately varied in accordance with the operation to be performed thereby.

Notations 39, 39' and 39'' refer to respective conduits in the form of small diameter tubes extending into the chambers 15, 16 and 17 which respectively surround the beam emitter, the elongated passageway 14' and the focusing pole pieces 28 and 28'. Respective solenoid operated valves or pumps controlled by signals generated by master controller 11 may be utilized to admit predetermined quantities of selected gases, vapors, liquids and/or powdered materials through the conduits 39, 39' and 39'' to be ejected from the open ends thereof into the electron beam and to be carried along the beam through the opening 26 against the surface of the work piece 40 intersected by the beam B.

The potential and movement of electrons or particles within the beam B may be sufficient to carry particles or droplets of material admitted to the beam along the beam to the surface of the work piece. However, auxiliary means are also provided in FIG. 1 to confine the material admitted to the beam to the vicinity of the beam and, in certain instances, to induce its movement along the beam, toward the work. Such means includes a plurality of electro-magnetic coils 23, 24 and 25 disposed along the passageway 14' which coils are energized in a manner to magnetically confine the particles to the vicinity of the beam and, in certain instances, to induce movement of the particles along the beam towards the work. The coil 25 may also serve to assist in focusing the beam through the focusing pole pieces 28, 28' so as to be focused at a fine point when it intersects a surface of the work.

Shown disposed within the intermediate chamber 16 is a coil 30 containing a wire 31 of material to be deposited, such as metal, which wire is guided about a plurality of rollers 32 and a pair of rollers 33 through a passageway between the coils 24 and 25 into chamber 14'. The rollers 33 are power operated by a motor (not shown) which is controlled by a motor controller 34 operated by a signal generated by the master controller 11. Thus, by properly programming master controller 11 to generate a signal which is passed to controller 34, the rate of travel of wire 31, as well as the timing of its admission to the beam B, may be predeterminately controlled so that predetermined quantities of the material of said wire may be vaporized and directed along the beam to be deposited onto the surface of the work piece in accordance with the predetermined operation of the beam and positioning of the work piece so that material may be predeterminately deposited onto select areas of th work piece.

Notation 35 refers to a reservoir of particulate material located within the intermediate chamber 16 which is fed by means of a conveyor or motorized pump 36 through a tube 38 extending therefrom. A controller 37 receiving command control signals from the master controller 11 is connected to the motor operating the pump or conveyor 36 so that predetermined quantities of said particulate material may be fed or directed on a gas stream into chamber 14' and the beam generated therein.

A second coil 56 of metal or other suitable material provided as a wire 58 is located within chamber 12 and is rotationally mounted off the upper wall thereof and driven by a motor 57 controlled by a signal generated by the master controller 11. The wire 58 is fed between powered rolls of a guide 59 which is driven by a motor (not shown) which is also controlled by a signal or signals generated by the master controller 11. The operation of the motor operating the vacuum pump 50 may also be controlled by the master controller 11 so as to predetermine a complete cycle of operation utilizing said vacuum pump.

It is noted that wire, particulate material, liquid or gaseous streams of matter may also be directed into the electron beam B at any of the locations where tubes 39, 39' and 39" enter the chambers 15 and 16.

The wires 31 and 58 may comprise various polymers, semiconductors or ceramics, metals or alloys. Where said wires or rods are made of conducting material such as metal, they are preferably electrically insulated from the housing and are not grounded in a manner which would ordinarily cause the beam B to discharge to ground. Similarly, all tubes 39, 39', 39", 38, etc. feeding fluent material to the beam are also preferably either made of electrical insulating material or are insulated from ground.

It is noted that the apparatus of FIG. 1 may be subject to a number of design variations and may include, for example, the provision of an endless conveyor for continuously or intermittently feeding work to be processed by the beam past the opening 26. The apparatus 10 may also be modified to permit movement of the beam housing 14 in one or more directions with respect to a large work piece and to control the location thereof with respect to selected work pieces for performing beam erosion and/or deposition operations as described. Operation of the means for energizing the electromagnetic coils 23, 24, and 25 for generating suitable magnetic fields in the vicinity of the beam to control its direction, focusing and to confine or control the flow of material admitted thereto, as described, may also be under the control of the master controller 11.

Further modifications to the apparatus of FIG. 1 include the provision of additional electrode means for generating a plurality of beams and directing same against one or a plurality of different areas of a work piece to simultaneously perform operations of the type described. For example, one beam may be operated to erode a selected area of a work piece while a second beam may be operated to selectively deposit material on another area of a work piece to both excavate and/or build up material on said work piece or to fill in areas which have been previously eroded. By simultaneously operating a plurality of beams to simultaneously deposit and/or erode material from the work piece surface, the time required to fabricate devices such as electronic circuits may be substantially reduced.

By providing means in chamber 12 for disposing lead wires against selected portions of a substrate such as an electrical circuit, one or more beams may be used to weld said wires to the substrate by melting a metal of the wire and/or depositing a weld material against the wire and substrate by means as described.

Thin or thick metal films may be deposited onto a substrate by admitting metal to the beam by one or more of the means described, as the substrate and/or beam means are moved or deflection controlled so as to form electrical circuit lines or leads on the substrate. Semiconducting, polyconducting or insulating materials may be selectively deposited on a substrate to form various electrical circuit components providing, for example, integrated circuits and the like.

Figures 2, 3, 4:
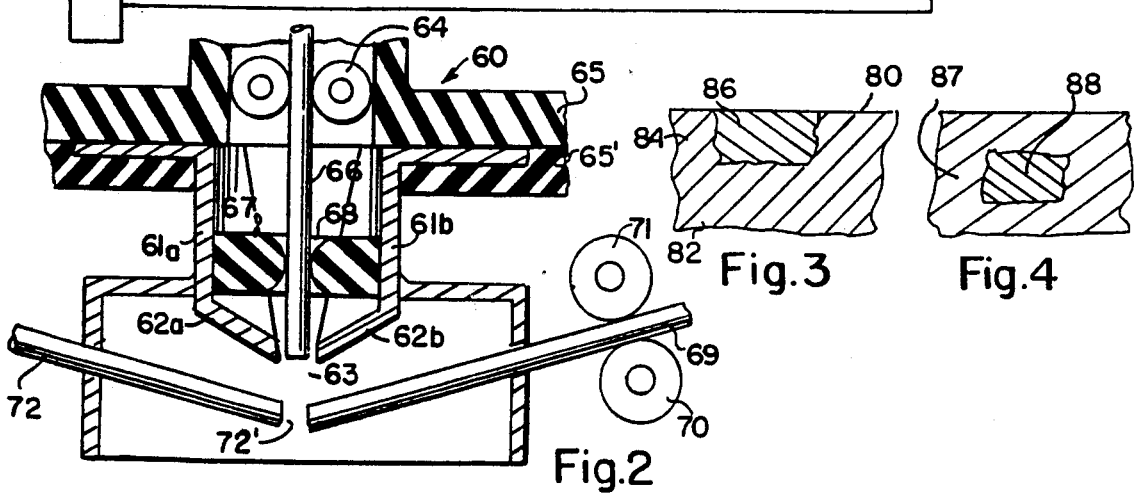
FIG. 2 is a side view of a modified form of electrode applicable to apparatus such as that illustrated in FIG. 1.
FIG. 3 is a side view in cross section of a structure produced by means of an apparatus of the type shown in FIG. 1.
FIG. 4 is a modified form of the structure shown in FIG. 3.

In FIG. 2 is shown a modified form of electron emitter and beam forming apparatus applicable to the apparatus of FIG. 1. The beam emitter assembly 60 is composed of opposed electrode portions 61a and 62b terminating at the end of the electrode and opening 63 therebetween through which material to be vaporized and carried by the beam may be fed. The electrodes may be made of suitable high temperature conducting material such as tungsten or other high temperature metal and are supported by insulating gasket plates 65 and 65'.

A first material 66 in the form of a rod or tube extends through the center of the electrodes 61a and 61b and is downwardly fed by means of a pair of powered rollers 64 operated by motor (not shown) which is preferably predeterminately controlled to control the feed, speed and timing of the drive of consumable member 66 in accordance with the operation of the computer or master controller as described. A guide 67 in the formof a plug of insulating material having an opening 68 therein receives rod 66 and guides it to the end of the conical head of the electrodes 61a and 61b. Suitable means, as described above, may be provided to heat the electrodes and the end of rod 66 a sufficient degree to cause said rod end to melt or vaporize within the beam generated by the electrodes. If the potential generator across the electrodes is of a sufficient intensity, the material melted or vaporized from the end of rod 66 will be carried along the beam towards the work as described.

The consumable electrode 66 may also comprise a hollow tube containing gaseous, liquid, vaporous or powdered material fed to the open end thereof to be dispensed into the zone in which the beam is generated.

Also illustrated in FIG. 2 is a rod 69 fed between powered rollers 70 and 71 to beneath the end of the conical electrodes 61a and 61b so as to be admitted to the vicinity thereof in which the intense beam is generated for melting or vaporizing the material of said rod.

A tube 72 is also shown in FIG. 2 which is connected to a source of fluent material such as described and having its open end 72' disposed immediately beneath the electrodes 61a and 61b so as to admit fluent material to the beam so generated for the purposes described.

While a source of electrical energy PS is shown in FIG. 1 as being operatively connected for operation of the master program controller or computer 11 which power supply may generate the electrical energy necessary to activate the controls or operate the various motors and servos of the apparatus 10, it is assumed that suitable power supplies are provided to operate all the described components such as the magnetic coils, the high voltage power supply 55, the filament supply 52, the bombardment and grid supplies 53 and 54 as well as the described material feed means and work positioning servos.

There is shown in FIG. 3 a structure in a work member which has been subjected to beam deposition operation of the type described. The work member 80 is composed of a base 82 having an upper stratum 84 composed of material deposited thereon such as semi-conducting material, metal or insulating material. Notation 86 refers to a domain of material other than that forming stratum 84 which has been beam deposited in an opening or cavity provided in 84 by the electron or intense laser beam or beams described. The material of which domain 86 is composed may comprise any suitable metal, semi-conducting materials or insulating material having characteristics which are different than those of the material defining layer 84 and may be utilized, for example, to form part of an active element of semiconductor device, an insulating or isolating element or domain adjacent to or surrounding an active element or a conducting element disposed in cooperative relationship to other materials (not shown) similarly deposited on or within the stratum 84.

In FIG. 4, a domain 88 of material is shown completely surrounded by a stratum 87 of material which has been deposited simultaneously and/or after the deposition of the material comprising domain 88.

Circuit conducting strip elements may also be similarly deposited along selected areas of a substrate or material deposited on a substrate to form various electrical devices and circuits. The substrate may comprise, in addition to various flat ceramic, glass or plastic materials, chips of silicon and other materials, crystals, filaments, wires, rods, foil and other electrical components and devices such as semi-conductors, integrated circuit assemblies and components, polyconducting layers, metal films, etc. In addition to depositing conducting and semi-conducting components as circuit elements, the means described herein may be used to deposit doping materials and isolating oxide materials, polyconducting materials, etc. on circuit members.

Figure 5:
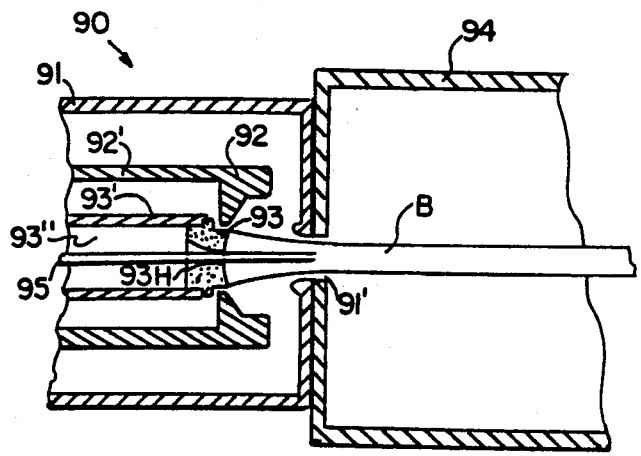
FIG. 5 is a sectioned side view of a hollow beam generating apparatus applicable to the apparatus of FIG. 1.
Figure 6:
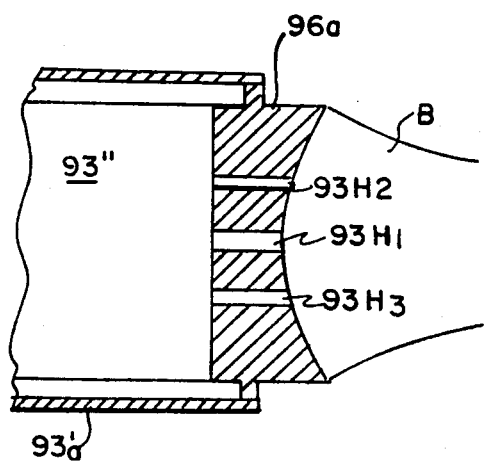
FIG. 6 is a side section view of a modified form of FIG. 5.
Figure 7:
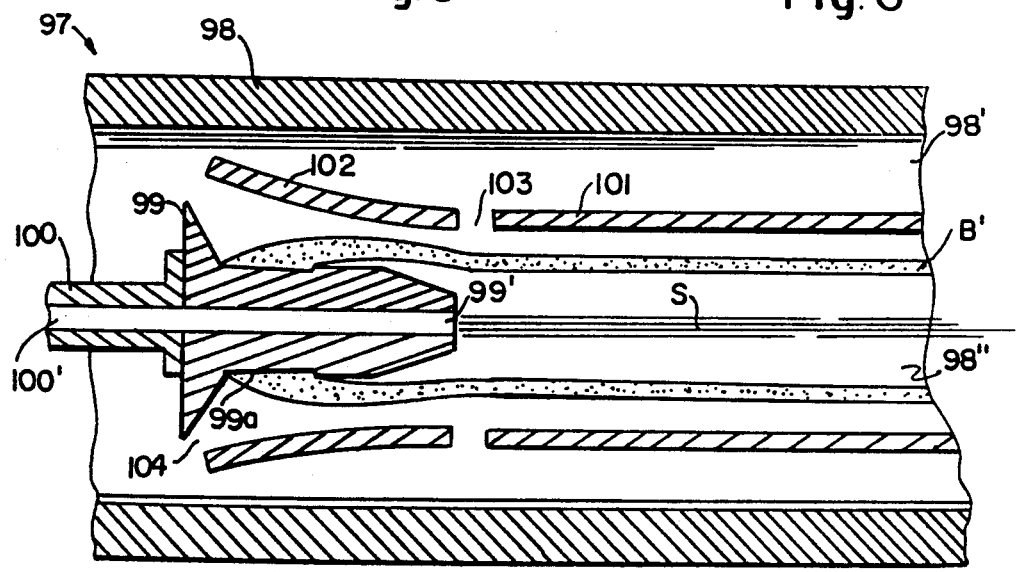
FIG. 7 is a side cross section of another form of hollow beam apparatus.

FIGS. 5 to 7 illustrate features of apparatus for forming hollow or tubular electron beams and for feeding one or more materials to the interiors of said hollow beams to be carried therewith and deposited on a substrate intersected by the beams or to cooperate with the beams in operating on the substrate. Features of the apparatus illustrated in FIGS. 5 to 7 may be applied to the apparatus of FIG. 1 or other suitable apparatus as described herein for performing various operations on solids, liquids, gases or matter in the plasma state. By "hollow or tubular electron beams" is meant electron beams which have the configuration of an elongated tube having a hollow interior or core which is not occupied by the radiation beam.

In FIG. 5, an electron beam generating apparatus 90 includes a first housing 91 in which is disposed an anode 92 attached to a mount 92'. A cathode head 93 is centrally disposed within the anode mount by means of its own mount 93' and faces an opening 91' in the housing 91 which extends through an opening in a second housing 94 which may extend to or be the equivalent of housing 16 of FIG. 1. The cathode head 93 when properly energized by a suitable source of high voltage electrical energy, is operative to generate a hollow electron beam B which converges as it passes through the opening 91' and is directed by suitable control and focusing means (not shown) out of an opening in housing 94 to the surface of a work piece such as a substrate or into a spacial volume beyond housing 94 containing gaseous or liquid matter to be reacted on by the beam. The cathode 93 contains an opening 93H therethrough, through which opening matter may be directed to the interior of the hollow beam B. Said matter may be in the form of a solid rod or wire, particulate material carried on an airstream or other fluid carrier directed through the interior volume 93" of the housing 93' and/or a gas or vapor flowed under pressure into the volume 93" and directed at suitable velocity through the opening 93H to the interior of the hollow beam B. In FIG. 5, notation 95 refers to a rod which is driven by wheel drive means as described which is operated by a controlled motor, preferably under the control of a master controller of the type shown in FIG. 1. The rod 95 may be driven completely along the center of the hollow beam B to the surface of the work piece at which surface it may be melted by heat transferred directly thereto by the beam B and/or the work piece itself intersected by the beam for coating, diffusing or otherwise depositing same onto the work piece. The rod 95 may also be vaporized by the intense heat of the beam B as said rod enters the narrowest portion of the beam and the resulting vaporized metal or other material defining the rod may be carried along the interior of the beam by flow induced by the beam itself, by gas directed along the center of the rod or adjacent thereto as it passes through the opening 93H in the cathode or by moving electromagnetic fields generated by electro-magnets disposed around the housing 94 as described.

The apparatus of FIG. 5 may also be operated wherein gas under pressure is forced through the opening 93H which may be in the shape of a nozzle operative to direct said gas as a high-velocity stream along the center of the beam to the surface of the work piece. The gas may be utilized per se in cooperation with the beam to effect such operations as cutting or severing portions of the work piece intersected by the beam and gas, creating a chemical reaction in which the gas effects a change in state of the work piece, boring or drilling a hole of predetermined shape and dimension through the work piece, moving material melted by the beam or rapidly oxidizing and vaporizing or volatizing material of the work piece for the purpose of removing or machining same. The gas may also contain fine particles of solid or vaporized matter which is deposited on the work piece for any of the purposes described or may be used to erode or cause flow of the work as described or may be injected into a gaseous or liquid material for creating a chemical reaction, effecting combustion to weld or rapidly heat the volume into which the beam is injected, create a plasma such as a plasma jet or generate thrust.

In FIG. 6, a modified form of the cathode of FIG. 5 is shown having a plurality of through and through openings therein through which openings may be injected, flowed or forced the same or different liquid, gaseous or solid materials. A mount 93"a for a concave cathode 96 is disposed as part of an electron beam apparatus of the type shown in FIG. 5 and is hollow, defining a passageway 93" through which a liquid, gas or plasma may be flowed out the openings 93H1, 93H2 and 93H3. The latter two openings are shown disposed radially outwardly of the axial opening 93H1. A plurality of additional openings may also be arrayed about the center opening 93H1.

In one form of the apparatus shown in FIG. 6, a solid rod or wire may be driven through the opening 93H1 while a gas or liquid may be admitted to the center of the beam B through the openings 93H2 and 93H3 after being forced through the passageway 93" behind the cathode. Solid material directed through the openings in the cathode may be vaporized as soon as or shortly after they enter the interior of the beam B by the high-intensity electrical energy applied to the cathode 96a.

In FIG. 7, an injection gun design is illustrated for initiating a hollow beam in a uniform magnetic field. The apparatus 97 includes an elongated cylindrical magnetic coil 98 surrounding a chamber 98' in which is supported, on a tubular mount 100, a cathode 99. A passageway 100' extends through the tubular mount 100 and may be utilized for directing a solid, liquid, gaseous and/or plasma material to a passageway 99; extending through the cathode 99. The cathode 99 has a conical cathode emitting surface 99a which is surrounded by a conical shaped anode 102. The beam B' emerges from the cathode emitting surface 99a and is directed by means of a uniform axial magnetic field generated by the magnetic coil 98 so as to form a tubular beam which is passed through a drift tube 101 in the direction of the work. A gas, vapor, plasma or gas containing particles, is forced through the passageway 100' and through the axial bore 99; extending through the cathode 99. It is ejected as a stream S through the center volume 98" of the beam B' and may be flowed as the result of its velocity and/or the force induced thereby by the magnetic field or the portion of a beam particles so as to be directed through the gun against the work volume or surface intersected by the beam B'.

It is noted that auxiliary fluid, such as gas, vapor, plasma particles or solid particles may be flowed between the head end of the anode 102 and the head of the cathode 99 through the annular opening 104 or through one or more openings 103 disposed between the anode 102 and the drift tube 101 so as to be carried between the outer surface of the beam B' and the drift tube in the direction of the work to be expelled from the end of the gun towards said work with the beam B'.

While the beam B' shown in FIG. 7 is illustrated as having a relatively thin wall, the volume 98" defining the interior of the beam which does not contain beam particles may be of relatively small diameter and, in one instance, may be substantially equal to or smaller than the diameter of the bore 99' through the cathode 99 so that the gas, liquid or plasma injected through the cathode may be in contact with the beam so as to be carried thereby towards the work or so that a solid rod or wire fed through the openings 100' and 99' may be easily vaporized as it enters the hollow beam B' and the vapors thereof may be carried by the beam in the direction of the work.

In order to properly vaporize a solid rod or particles introduced into the interior volume 98" of the beam B, focusing magnetic coils may be applied downstream of the snout end of the cathode 99 to cause a pinch effect in the beam B' so as to converge the beam particles against the solid material directed into the interior of the beam for the purpose of vaporizing said material.

In a modified form of the apparatus hereinabove described, a solid rod of ion-forming material such as cesium may be directed through the annular passageway in the cathodes described or otherwise disposed along the cathode and the apparatus may be operated in such a manner as to generate ions thereof for the purpose of effecting thrust to effect propulsion of the apparatus such as rocket propulsion.

In the operation of the apparatus described, it is noted that the same beam employed to vaporize and effect deposition of material on a substrate may also be employed to erode selected portions of the substrate prior to or after material is deposited thereon. These distinct operations may be effected by program and/or adaptively controlling beam intensity, beam focus, relative movement of the beam and/or workpiece and the time the beam remains on the area being eroded so as to predetermine the depth of the cavity. Thus predeterminately contoured substrates may be formed by program controlling the above variables to erode and/or deposit material across the surface of the substrate. Electrical circuits composed of crystals or other devices having domains of different materials located at different depths therein may be so fabricated as well as prototype models or mold cavities having irregular shape.

Modified forms of the invention illustrated in FIGS. 1, 2, 5, 6 and 7 include the following embodiments:

(a) a plurality of different materials may be controllably fed simultaneously or sequentially into the intense radiation beam by predeterminately controlling the operation of respective motors or valves operative to admit said materials to the chamber and beam in a program controlled cycle determined by the operation of the master controller or computer 11 in open and/or closed loop cycles with or without the application of adaptive control thereto. Such plurality of materials may all be in the same or different states (i.e.—solid wire formations, flowed particles, liquid streams, gas or vapor streams or streams of charged particles such as plasma streams).

(b) The movement of electrons defining the beam may be utilized to induce the flow of the material in the beam to flow along the beam. In this connection, the particles of deposition material flowed to the beam or formed therein may be charged as they enter the beam or precharged prior to admission to the beam so that the combination of forces resulting from formation of the beam and its directional control means may be utilized to carry the deposition material particles along the beam towards the work. Auxiliary magnetic field coil means may be disposed along the beam to account for and direct deposition material around or within the beam towards the work. Said coils may be operative to generate static magnetic fields or moving magnetic fields which move in the direction of the beam to induce flow of the material admitted to the beam along the beam in the direction of the work.

(c) An auxiliary gas stream such as a stream of inert gas or active gas, may be directed from a conduit along the electron beam to induce flow of particles of material admitted to the beam to cause said particles to intersect the area of the work intersected by the beam or the area immediately adjacent thereto. Said gas may be introduced at one or more locations along the path of travel of the beam and controlled in accordance with the quantity and characteristics of the material admitted to the beam.

(d) The flow of the hereinabove described materials along the beam may be effected by generating a plasma at least in part by the operation of the beam and/or auxiliary electrode means surrounding the electrode which operates to generate the beam by admitting suitable material to the vicinity of said electrodes. Said plasma may be flowed as a stream surrounding the beam by suitable magnetic field generating means such as one or more electro-magnets disposed adjacent to the beam along its path of travel. Such plasma, if generated at relatively high temperature, may also be operative to cooperate with the beam in heating the surface of the work.

(e) The illustrated and above described embodiments may all utilize one or more electron beams or one or more laser light beams generated at sufficient intensity to effect the desired described results. For example, solid wire or rod, particulate, vaporous, liquid ior gaseous material may be introduced into the intense light beam generated by the laser disposed in the vicinity of the electrodes illustrated and may be vaporized thereby and carried along the laser beam towards the work by one or more of the means described. Particle charging or ionizing means may be provided in the vicinity of the laser or along the beam to form a plasma-like flow of material along the beam towards the work.

(f) A plurality of electron and/or laser beams may also be generated within the chamber and each predeterminately directed to intersect a selected area or the same area of the surface of the work. One or more materials to be deposited onto the work may be introduced into each beam. One of the beams may be operative to erode preselected portions of the work substrate while one or more other beams may be operative to deposit selected amounts of material onto the substrate.

(g) The described beam or beams may be operated at sufficient intensity to not only vaporize or otherwise change the state of material admitted to the beam but also to cause the diffusion of said material into the substrate intersected by the beam after properly heating that portion of the substrate receiving the fused material. In other words, the velocity of the beam particles may be operative to cause deposition particles carried thereby to be diffused into the surface stratum of the work intersected by the beam and deposition material.

(h) Since the cathode current density increases exponentially with temperature and since relatively high temperatures may be required to vaporize certain material to be deposited, to generate plasmas or to more rapidly machine the work b8y generating beams of relatively high voltage (above 20 kV), the intense radiant energy beam of a laser may be employed to heat the cathode and/or the material being fed to the electron beam or the surface of the work intersected by said beam. Said laser may be conveniently located within the chamber 12 or any of the compartments of the chamber 11. The laser may also be disposed exterior of the electron gun housing with its beam directed thru an opening or window thereto such as through the passageways 39, 39' or 39''. The laser may also be supported on the shield 21, the mount for grid 22 or the insulation material supporting the cathode and may have its beam directed to intersect the cathode wire or rod 20 to supplement or replace the heating filament 19.

(i) The intense radiation beam of a laser disposed within or directing said beam through the chambers 11 and/or 12 may be utilized to cooperate with the electron beam generated by the apparatus described herein in operating on the work such as in performing operations of heating, melting, vaporizing or otherwise affecting the work. In this connection, a single laser may be employed to perform a plurality of operations in cooperation with the electron-gun apparatus such as heating the cathode and vaporizing material to be deposited, heating the cathode and the work, generating a plasma and heating the work, vaporizing material from the work while or before material is deposited by the electron beam as described or other combinations of the aforedescribed operations. A single beam may be directed to perform these multiple operations or may be split into a plurality of components and properly directed by suitable lens and/or mirror means.

(j) The described apparatus may also be utilized to perform controlled operations on liquids, vapors, gases or plasmas into which the beams and materials accompanying same are directed in a reaction chamber or free space. These operations may include controlled chemical reactions, plasma generation propulsion systems, the operation of burning devices such as furnaces and welding equipment operated at high temperature. In this latter connection, the material injected into, inside or along the beam may be oxygen, an inert gas, a material to be added for alloying, doping or adding to the material being heated or otherwise operated on by the beam.

(k) Material directed into the beam in the vicinity of the work may comprise a combustible or explosive material operative to burn above the work or generate a controlled explosion for affecting the work such as generating a chemical reaction therewith, eroding or pulverizing part or all of the work, generating a larger explosion in the vicinity of or utilizing the work, generating a controlled nuclear reaction, etc.

(l) In another modified form of the invention, an electron beam or laser beam of the type described above, or other form of intense radiation energy, such as microwave energy generated and directed into the reaction chamber 12, may be employed to generate a plasma containing ions of material or materials of the types described to be deposited onto a workpiece disposed, as described, in the chamber. Such plasma may be caused to flow within and/or along one or more beams of radiant energy, such as that employed to generate the plasma or auxilliary radiant energy beams of the same or different type than that employed to form the plasma and directed at a select area of the surface of the work. Such plasma may also be generated to completely fill the interior of the reaction chamber or a select reaction zone thereof include the volume immediately adjacent to or surrounding the work to be coated in the chamber. In the latter embodiment, where the plasma completely fills the chamber or a select volume thereof in which the work is disposed, one or more intense laser or electron beams may be passed through the plasma to the surface of the work to predeterminately heat same and effect deposition and bonding of ions of the plasma and/or non-ionised particles of matter thereon onto a select area or areas of the surface of the substrate. Such beam or beams may also be deflection controlled by signals generated by the computer 11 to predeterminately scan a select area or areas of the work or substrate 40 to perform one or more of the functions of selectively depositing a material on a select area or areas of a workpiece by coating and/or implanting particles of matter supplied from the scanning beam and/or plasma surrounding or disposed adjacent the surface thereof.

What is claimed is:

1. An apparatus for selectively depositing material onto a substrate comprising in combination:
   (a) first means for supporting a workpiece,
   (b) second means supported adjacent said first means for generating a beam of collimated radiation,
   (c) third means for feeding a first material into said beam of collimated radiation a distance away from a surface of said workpiece adapted to receive said first material,
   (d) fourth means for operating said beam generating means at sufficient intensity to permit the beam generated thereby to change the state of the quantity of said first material fed into said beam by said third means,
   (e) fifth means for directing said beam at said workpiece along a path to cause it to intersect a select area of a surface of said workpiece and to heat the material of said workpiece defining said select area to a temperature for bonding said first material thereto, and
   (f) sixth means for controlling said third means feeding said first material into said beam and said fourth means to cause a select amount of said first material to be fed to said beam and to cause said radiation beam to carry and direct said select amount of said first material against and become integrally bonded to the material defining said select area of said workpiece.

2. An apparatus in accordance with claim 1 wherein said first material is in the form of a wire and said second means is controlled by said fourth means to generate said beam at sufficient intensity to vaporize the end portion of said wire as it is fed into said beam,
   said third means including a motor and a drive for said wire operated by said motor for driving said wire into said beam along a path located a distance from the select area of the surface of said workpiece intersected by said beam and
   receiving said first material vaporized in said beam and directed therealong to the surface of said workpiece.

3. An apparatus in accordance with claim 1 including seventh means for effecting controlled relative movement between said workpiece and the beam generated by said second means to cause said beam to scan select areas of the surface of said workpiece while said third means is controllably operated by said sixth means to feed said first material into said beam to cause said first material to be selectively deposited onto an extended portion of said workpiece including the portion thereof which is first intersected by said beam and receives the first amount of said first material fed into said beam.

4. An apparatus in accordance with claim 3 including eighth means having a housing defining a work chamber supporting said first means to position a workpiece within said housing, and
   ninth means for feeding a workpiece to said first means from the exterior of said housing prior to operating thereon by the radiation beam generated by said second means and for removing said workpiece from said housing after completing operations thereon within said housing.

5. An apparatus in accordance with claim 4 including master control means for automatically controlling the operation of said second to said ninth means in a cycle effecting the deposition of select amounts of said first material onto at least one select portion of the surface of a workpiece handled by said ninth means.

6. An apparatus in accordance with claim 1 including means for relatively moving the workpiece supported by said first means while said first material is fed into said beam by said third means under the control of said sixth means to cause said beam to scan a select area of the surface of said workpiece including thee area thereof first intersected by said beam and to deposit and integrally bond said first material fed to said beam onto said select area.

7. An apparatus in accordance with claim 1 including means operable to generate and direct said beam in a manner to diffuse said first material into the surface stratum of the material defining said select area of said workpiece.

8. An apparatus in accordance with claim 1 wherein said third means is operable to feed said first material as a stream of particles into said beam and
   said second means is operable to generate said beam in a manner to cause the particles introduced into said beam by said third means to flow along said beam so as to intersect that portion of the surface of said workpiece which is substantially intersected by said beam of collimated radiation.

9. An apparatus in accordance with claim 1 wherein said fourth means is operable to control said first means to generate said radiation beam at an intensity sufficient to vaporize said first material introduced into said beam and to cause said vaporized first material to be directed along said beam to the surface of said workpiece.

10. An apparatus in accordance with claim 8 including
    means for charging the particles of said first material fed to said radiation beam and
    magnetic field generating means for generating a magnetic field in the vicinity of said beam which magnetic field is operable to direct the charged particles fed to said beam to the area of the surface of the workpiece intersected and heated by said beam.

11. An apparatus in accordance with claim 1 wherein said third means is operable to supply and feed said first material as a stream of gas molecules and said stream of gas molecules is directed along said beam under the control of said sixth means to the surface of said workpiece.

12. An apparatus in accordance with claim 1 including
means for effecting relative scanning movement between said radiation beam and a workpiece supported by said first means, and
means controlling said second means to generate said beam at an intensity sufficient to cause the beam to predeterminately erode material from the surface of said workpiece.

13. An apparatus in accordance with claim 12 including
means for controlling said second means to sequentially operate said beam to sequentially erode material from the surface of said workpiece and deposit material onto the surface of said workpiece intersected by said beam.

14. An apparatus in accordance with claim 1 including
means for generating a plasma in the vicinity of said beam,
means for introducing particles of said first material into said plasma and causing said plasma and said particles to flow to the surface of said workpiece intersected by said beam.

15. An apparatus in accordance with claim 1 including
means for generating a plasma of particles of said first material,
said plasma generating means including the radiation of said beam, and
means for employing the radiation of said beam and said plasma to form a coating of matter contained in said first material on the surface of said workpiece.

16. An apparatus in accordance with claim 1 wherein
said first material is composed of two different materials and
said third means is operatively controlled by said sixth means to controllably feed said two materials into radiation defined by said beam.

17. An apparatus for selectively depositing material onto a substrate comprising in combination:
(a) first means for supporting a workpiece,
(b) second means supported adjacent said first means for generating a beam of operating radiation,
(c) third means for directing said beam to cause it to impinge on and intersect a select portion of the surface of said workpiece,
(d) fourth means for feeding a first material into said beam of radiation at a location a distance away from the surface of said workpiece intersected by said beam,
(e) fifth means for directing the material introduced into said beam along said beam towards said workpiece to cause said material to be carried to and deposited on the surface of said select portion of said workpiece intersected by said beam,
(g) sixth means for controlling said second means to generate said beam at sufficient intensity to heat the material introduced into said beam and the material of said workpiece to a temperature for bonding said first material deposited on said workpiece to the material of said workpiece.

18. An apparatus in accordance with claim 17 including
means for generating said beam of operating radiation at sufficient intensity to change the state of said first material introduced into said beam by said fourth means and to form particles of said first material in said beam.

19. An apparatus in accordance with claim 18 wherein
said beam is operable to form a plasma of particles of said first material formed therein,
said beam generating means being operable to generate said beam in a manner to carry at least a portion of said plasma in the direction of movement of said beam and to deposit particles of said plasma against the surface of said workpiece intersected by said beam.

20. A method for selectively depositing material onto a substrate to form a composite article of said deposited material and the material of said substrate, said method comprising:
(a) generating a beam of radiation and directing said radiation through a reaction chamber containing a workpiece supported therein,
(b) controllably feeding a first material in a gaseous state into said reaction chamber to cause molecules of said first material to intersect said beam whereby the radiation of said beam interacts with said gaseous molecules and causes gaseous matter to be directed against and become deposited on a select area of said substrate, and
(c) heating the material defining said select area of said substrate with the radiant energy of said beam to render the heated material receptive of the deposited material so as to cause said deposited material to become integrally bonded to the surface of said workpiece against which it is deposited.

21. A method in accordance with claim 20 wherein
said radiation is a narrow beam of coherent radiation generated at sufficient intensity to carry molecules of said gas along said beam to the area of said workpiece intersected by said beam.

22. A method for depositing material onto a substrate to form a composite material of said substrate material and the material deposited thereon, said method comprising:
(a) generating a beam of operating radiation capable of changing the state of matter and directing said beam through a reaction chamber containing work to be operated on by the radiation of said beam,
(b) controllably feeding a material in a gaseous state into said reaction chamber and into the radiation of said beam of operating radiation to subject the molecules of said gaseous material to the radiant energy of said beam whereby said radiation interacts with said gas molecules,
(c) utilizing the radiant energy of said beam to ionize the gas in said chamber and to generate a plasma of ionized particles formed at least in part of said material fed into said reaction chamber and causing said plasma to flow to a surface of the work contained in said reaction chamber, and
(d) depositing at least a portion of said first material onto said surface of said work and heating both the material of the work and the material deposited on its surface with the radiant energy of said beam to cause the deposited material to become bonded to the surface of said work and to form a composite structure therewith.

23. A method in accordance with claim 22 which includes
controllably feeding a plurality of different materials, each in a gaseous state, into said reaction chamber to form a mixture of molecules of said plurality of materials in said chamber and reacting on the molecules of said mixture of gaseous materials with the radiation of said beam to deposit material from said mixture onto the surface of said work in said chamber.

24. A method in accordance with claim 22 which includes
forming a coating on the surface of said work with the material deposited thereon.

* * * * *

UNITED STATES PATENT AND TRADEMARK OFFICE
CERTIFICATE OF CORRECTION

PATENT NO.   : 4,853,514
DATED        : August 1, 1989
INVENTOR(S)  : Jerome H. Lemelson It is certified that error appears in the above-identified patent and that said Letters Patent is hereby corrected as shown below:

Column 1,
Line 6, under Cross Reference to Related Applications, replace the entire paragraph with -- This application is a continuation of application Serial No. 643,883, filed August 24, 1984, abandoned; which is a continuation of Serial No. 571,188, filed April 24, 1975, abandoned; which is a continuation of Serial No. 163,203, filed July 16, 1971, abandoned; which is a continuation of Serial No. 849,013, filed August 11, 1969, abandoned; which is a continuation-in-part of four applications: (1) Serial No. 422,875, filed November 25, 1964, now U.S. Patent 3,461,347, (2) Serial No. 691,676, filed November 27, 1967, now abandoned, (3) Serial No. 710,517, filed March 5, 1968, abandoned, which is a continuation-in-part of Serial No. 501,395, filed October 22, 1965, now U.S. Patent 3,371,404, and (4) Serial No. 421,897, filed December 29, 1964, now U.S. Patent 3,507,063, which is a continuation-in-part of Serial No. 734,340, filed May 9, 1958, now U.S. Patent 3,173,175. --

Signed and Sealed this

Fourteenth Day of October, 2003

JAMES E. ROGAN
*Director of the United States Patent and Trademark Office*